United States Patent
Kudo

(10) Patent No.: US 8,089,325 B2
(45) Date of Patent: Jan. 3, 2012

(54) OVEN CONTROLLED MULTISTAGE CRYSTAL OSCILLATOR

(75) Inventor: Tetuo Kudo, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 71 days.

(21) Appl. No.: 12/653,061

(22) Filed: Dec. 8, 2009

(65) Prior Publication Data
US 2010/0164635 A1 Jul. 1, 2010

(30) Foreign Application Priority Data
Dec. 25, 2008 (JP) .................................. 2008-330235

(51) Int. Cl.
*H03B 5/32* (2006.01)
(52) U.S. Cl. ............... 331/158; 331/116 R; 331/116 FE; 331/176
(58) Field of Classification Search .................. 331/158, 331/176, 116 FE, 116 R
See application file for complete search history.

(56) References Cited

U.S. PATENT DOCUMENTS
7,471,162 B2 * 12/2008 Ishikawa et al. ................ 331/68

FOREIGN PATENT DOCUMENTS
| JP | SHO59-149709 | 10/1984 |
| JP | 2005-223395 | 8/2005 |
| JP | 2005-341191 | 12/2005 |
| JP | 2006-295570 | 10/2006 |

OTHER PUBLICATIONS

Office Action of the Japanese Patent Office dated Jan. 18, 2011 for the Priority Application No. 2008-330235.

* cited by examiner

*Primary Examiner* — Arnold Kinkead
(74) *Attorney, Agent, or Firm* — Scott D. Wofsy; Edwards Wildman Palmer LLP

(57) ABSTRACT

An object of the invention is to provide an oven controlled crystal oscillator that prevents a reduction in characteristics due to temperature rise in the crystal vibrator and circuit elements other than the oscillating stage, and that increases energy efficiency of a heater element, to thereby facilitate temperature control. The oven controlled crystal oscillator of the invention is an oven controlled multistage crystal oscillator provided with: a crystal vibrator; circuit elements of an oscillating stage, a buffering stage, and a temperature control circuit; and first, second, and third circuit substrates, wherein the configuration is such that: on the first circuit substrate or the second circuit substrate, there are arranged the heater element and the circuit element of the oscillating stage thermally bonded to the heater element; on the third circuit substrate, there are arranged the circuit element of the buffering stage, and at least the circuit elements of the temperature control circuit excluding the heater element and the temperature sensor element; and the third circuit substrate is distanced in the vertical direction and thermally isolated, with a clearance, from the first and second circuit substrates.

4 Claims, 7 Drawing Sheets

OVEN CONTROLLED MULTISTAGE CRYSTAL OSCILLATOR

BACKGROUND OF THE INVENTION

1. Technical Field

The present invention relates to an oven controlled multistage crystal oscillator (hereunder, referred to as an "oven controlled crystal oscillator"), and in particular, to an oven controlled crystal oscillator with a high level of frequency stability.

2. Background Art

An oven controlled crystal oscillator is capable of maintaining a constant operating temperature of a crystal oscillator, and hence the level of frequency stability thereof is high. Therefore, it is applied to communication devices for basestation use in which frequency deviation of ppb (pulse per billion) units is required for example. In recent years, miniaturization is prevailing also in base-station use, and there has been available, for example, one that uses a chip resistor or the like as a heater element, instead of a conventional constant temperature heat cylinder with a heating coil wound thereon.

3. Prior Art

FIG. 6A, FIG. 6B, and FIG. 6C are drawings for describing an oven controlled crystal oscillator of a conventional example of the present invention, wherein FIG. 6A is a sectional view of the oven controlled crystal oscillator, FIG. 6B is an oscillation output circuit diagram thereof, and FIG. 6C is a temperature control circuit diagram thereof.

The conventional oven controlled crystal oscillator has a crystal vibrator 1, circuit elements 4 that constitute an oscillation output circuit 2 and a temperature control circuit 3, first and second circuit substrates 5a and 5b, and a metallic container 6. The crystal vibrator 1 has a crystal piece 1a of AT cut or SC cut for example, and it is, for example, seal-enclosed within a surface mount container 1b having external terminals.

In a case of either cut, the crystal piece 1a, with a limit value in the vicinity of 80° C. on the high temperature side at or above normal temperature 25° C., has a frequency-temperature characteristic in which oscillation frequency varies, depending the temperature. For example, AT cut gives a cubic curve shown with the curved line A in FIG. 7, and SC cut gives a cubic curve shown with the curved line B in FIG. 7. The vertical axis in FIG. 7 represents frequency deviation $\Delta f/f$ where f denotes a frequency at a normal temperature and $\Delta f$ denotes a frequency difference with respect to the frequency f.

The oscillation output circuit 2, as shown in FIG. 6B, includes an oscillating stage 2a serving as an oscillation circuit, and a buffering stage 2b having a buffering amplifier and the like. The oscillating stage 2a is of a Colpitts type having a voltage dividing capacitor and an oscillation transistor (not shown in the drawing) that constitute, together with the crystal vibrator 1, a resonance circuit. Here, for example, the oscillation output circuit 2 is of a voltage control type having a voltage-variable capacitive element 4a within an oscillating loop thereof. In FIG. 6B, reference symbol Vcc denotes power supply, reference symbol Vout denotes output, and reference symbol Vc denotes control voltage.

Furthermore, in the temperature control circuit 3, as shown in FIG. 6C, a temperature sensor voltage Vt from a temperature sensor element 4c (thermistor, for example) and a resistor 4d, is applied to one input terminal of an operational amplifier 4b, and a reference voltage Vr from resistors 4e and 4f is applied to the other input terminal. A voltage difference between the reference voltage Vr and the temperature sensor voltage Vt is applied to the base of a power transistor 4g, and electric power from the power supply Vcc is supplied to a chip resistor (heating resistor) 4h serving as a heater element. As a result, electric power to the heating resistor 4h is controlled with a resistor value that is dependent on the temperature of the temperature sensor element 4c, thereby maintaining the operating temperature of crystal vibrator 1 at a constant temperature.

The first and second circuit substrates 5a and 5b, as shown in FIG. 6A, both have a wiring pattern formed thereon, and for example, the first circuit substrate 5a is of a ceramic made substrate and the second circuit substrate 5b is of a glass epoxy made substrate. On one principal surface of the first circuit substrate 5a, there is arranged the crystal vibrator 1, and on the other principal surface, for example, there are arranged the heating resistor 4h and the temperature sensor element 4c of the temperature control circuit 3. On the heating resistor 4h and the temperature sensor element 4c, there is coated a thermally conductive liquid resin 7.

The second circuit substrate 5b is such that, as shown in FIG. 6A, on both principal surfaces thereof, there are arranged respective circuit elements 4, other than those described above, of the oscillation output circuit 2 and the temperature control circuit 3, and in particular, circuit elements 4 of the oscillating stage 2a are arranged in the central region thereof The first and second circuit substrates 5a and 5b are electrically and mechanically connected by metallic pins 8a, and there is provided a two-stage structure with the substrate surfaces facing each other. In this case, the thermally conductive resin 7 coated on the heating resistor 4h and the temperature sensor element 4c comes into close contact with the central region of the second circuit substrate 5b, and is thermally bonded to the second circuit substrate 5b, thereby maintaining the constant operating temperature of the circuit elements 4 serving as the oscillating stage 2a in particular.

The metallic container 6 shown in FIG. 6A is made airtight with glass 9 at least in four corner sections thereof, and it includes a metallic base 6a, through which lead wires 8b serving as so-called airtight terminals pass, and a metallic cover 6b sealed thereon by means of resistance welding or the like. The second circuit substrate 5b is electrically and mechanically connected to the lead wires 8b of the metallic base 6a, and is seal-enclosed within the metallic container 6 together with the first circuit substrate 5a.

In such a conventional oven controlled crystal oscillator, the operating temperature of the crystal vibrator 1 that governs the frequency-temperature characteristic of the oscillation output Vout shown in FIG. 6B, is maintained constant, while maintaining the temperature of the respective circuit elements 4 that constitute the oscillation circuit (oscillating stage) 2a at a constant temperature. Consequently, the operating temperature not only of the crystal vibrator 1 but also of the oscillating stage 2a is maintained constant, and hence it is possible, without being influenced by their frequency-temperature characteristics, to obtain frequency stability with frequency deviation $\Delta f/fo$ of at least ±0.01 ppm or greater, or of ppb units. Here, fo denotes a nominal value of oscillation frequency, and $\Delta f$ denotes an amount of deviation from the nominal value fo. (Refer to Japanese Unexamined Patent Publication No. 2005-341191, and Japanese Unexamined Patent Publication No. 2005-223395)

Problems in Prior Art

However, the conventional oven controlled crystal oscillator of the above configuration has the following problems attributable to the structure for maintaining and further stabilizing the operating temperature, not only of the crystal vibrator 1 that governs the frequency-temperature characteristics but also, in particular, of the oscillating stage 2a that significantly influences oscillation output. That is to say, in this conventional example, the first and second circuit substrates 5a and 5b are thermally bonded by the thermally conductive resin 7, to thereby maintain the constant operating temperature of the respective circuit elements 4, including the oscillation transistor, of the oscillating stage 2a.

However, in this case, the second circuit substrate 5b also has, in addition to the oscillating stage 2a, the buffering stage 2b and the circuit elements 4 of the temperature control circuit 3 arranged thereon as shown in FIG. 6A and FIG. 6B, and they are exposed to high temperature as with the oscillating stage 2a. That is to say, the crystal vibrator 1 that governs the oscillation frequency, and the buffering stage 2b and a number of the circuit elements 4 of the temperature control circuit 3 in addition to the oscillating stage 2a, are exposed to high temperature. Consequently, there is a problem in that these circuit elements 4 have reduced characteristics due to temperature rise, and cause instability in the oscillation output characteristic including oscillation frequency at normal temperature for example.

The capacity after the buffering stage 2b with respect to the load capacity (series equivalent capacity) observed from the crystal vibrator 1 that determines oscillation frequency, is extremely small and can be ignored. Consequently, influence, at the buffering stage 2b, of the frequency-temperature characteristic of the circuit elements 4 on oscillation frequency can also be ignored, and basically, it is not necessary to maintain the operating temperature of these circuit elements 4 at a constant temperature. Moreover, since the temperature control circuit 3 is not electrically connected to the oscillation output circuit 2 and is independent therefrom, it does not influence oscillation frequency. However, reduced characteristics due to temperature rise in the buffering stage 2b of the oscillation output circuit 2 and the circuit elements 4 of the temperature circuit 3, becomes a problem.

Furthermore, the second circuit substrate 5b has not only the oscillating stage 2a but also the buffering stage 2b and the circuit elements 4 of the temperature circuit 3 arranged thereon. Therefore, the thermal capacity of the second circuit substrate 5b increases. Consequently, a large amount of heat from the heating resistor 4h is required, and the amount of electric power consumption increases, resulting in reduction in energy efficiency. There is also a problem in that the region to be temperature-controlled with the heating resistor 4h inevitably increases, and therefore heat distribution within the metallic container 6 becomes uneven, making temperature control more difficult.

Purpose of the Invention

An object of the present invention is to provide an oven controlled crystal oscillator that prevents a reduction in characteristics due to the abovementioned temperature rise in the crystal vibrator and circuit elements other than the oscillating stage, and that increases energy efficiency of a heater element, to thereby facilitate temperature control.

SUMMARY OF THE INVENTION

The present invention relates to an oven controlled crystal oscillator comprising: a crystal vibrator with a crystal piece seal-enclosed therein and having external terminals; circuit elements of an oscillating stage that constitutes an oscillation output circuit together with the crystal vibrator, and of a buffering stage that buffer-amplifies output of the oscillating stage; circuit elements of a temperature control circuit that at least has a heater element that heats the crystal vibrator and a temperature sensor element that detects operating temperature of the crystal vibrator, and that maintains the operating temperature of the crystal vibrator at a constant temperature; a first circuit substrate having the crystal vibrator and at least some of the circuit elements arranged thereon; circuit substrates other than the first circuit substrate that are arranged in a vertical direction with respect to the first circuit substrate and that have the crystal vibrator and circuit elements other than the some circuit elements arranged thereon; and a metallic container that houses the crystal vibrator, the circuit elements, the first circuit substrate having these crystal vibrator and the circuit elements arranged thereon, and the circuit substrates other than this, wherein the configuration is such that: the circuit substrates other than the first circuit substrate include a second circuit substrate and a third substrate; on the first circuit substrate or the second circuit substrate, there are arranged the heater element and the circuit element of the oscillating stage thermally bonded to the heater element; on the third circuit substrate, there are arranged the circuit element of the buffering stage, and at least the circuit elements of the temperature control circuit excluding the heater element and the temperature sensor element; and the third circuit substrate is distanced and thermally isolated, with a clearance, from the first and second circuit substrates.

Effect of the Invention

According to such a configuration, the crystal vibrator and the circuit element of the oscillating stage that most significantly influence oscillation output (frequency), and the heater element are thermally bonded, to thereby maintain the operating temperature of the crystal vibrator and the circuit element of the oscillating stage at a constant temperature. Consequently, it is possible to prevent fluctuations in frequency caused by the crystal vibrator and the circuit element of the oscillating stage based on the frequency-temperature temperature characteristics thereof, and increase frequency stability of the oven controlled crystal oscillator.

The heater element targets the crystal vibrator and the circuit element of the oscillating stage as minimal heating targets, and elements other than these, such as the circuit element of the buffering stage and at least the circuit elements of the temperature control circuit excluding the heater element and the temperature sensor element, are thermally isolated from the heater element. Consequently, the targets of heating are limited to a bare minimum of circuit elements, and thermal capacity is minimum. Therefore, it is possible to increase energy efficiency of the heater element.

In this case, the capacities of the circuit elements of the buffering stage and the temperature control circuit observed from the crystal vibrator (oscillating stage) are extremely small. Consequently, even if the circuit elements of the buffering stage and the temperature control circuit have a frequency-temperature characteristic, fluctuation in the load capacity (series equivalent capacity) observed from the crystal vibrator can be ignored, and the influence on oscillation frequency at the oscillating stage can be ignored.

In an embodiment 1 of the present invention: the first circuit substrate has the crystal vibrator arranged on one of the principal surfaces thereof, and has the heater element on the other principal surface thereof; on the second circuit substrate there is arranged the circuit element of the oscillating stage; and the heater element of the first circuit substrate and the second circuit substrate are thermally bonded by means of a thermally conductive resin. As a result, the thermal bonding of the crystal vibrator and the circuit element of the oscillating stage with respect to the heater element, is made reliable.

In an embodiment 2 of the present invention, the crystal vibrator and the circuit element of the oscillating stage are arranged on the first circuit substrate and are housed within a heat cylinder, and the heat cylinder is thermally bonded to the heater element arranged on the second circuit substrate by means of a thermally conductive resin. As a result, the thermal bonding of the crystal vibrator and the circuit element of the oscillating stage with respect to the heater element, is made reliable. In this case, since the crystal vibrator and the circuit element of the oscillating stage are housed within the heat cylinder, the capacity thereof is smaller than that of the metallic container, and temperature distribution within the heat cylinder becomes stabilized. Therefore, it is possible to facilitate temperature control within the heat cylinder to thereby further increase frequency stability.

In a third embodiment of the present invention, the heater element is a chip resistor, or is a power transistor in the temperature control circuit. As a result the heater element that heats the crystal vibrator and the like is made definite. This heater element also includes a case where only a chip resistor, only a power transistor, or both of them are used.

BRIEF DESCRIPTION OF THE DRAWINGS

FIG. 6 includes drawings for describing a conventional example, wherein

DETAILED DESCRIPTION OF PREFERRED EMBODIMENT

Embodiment 1

Figure 1:
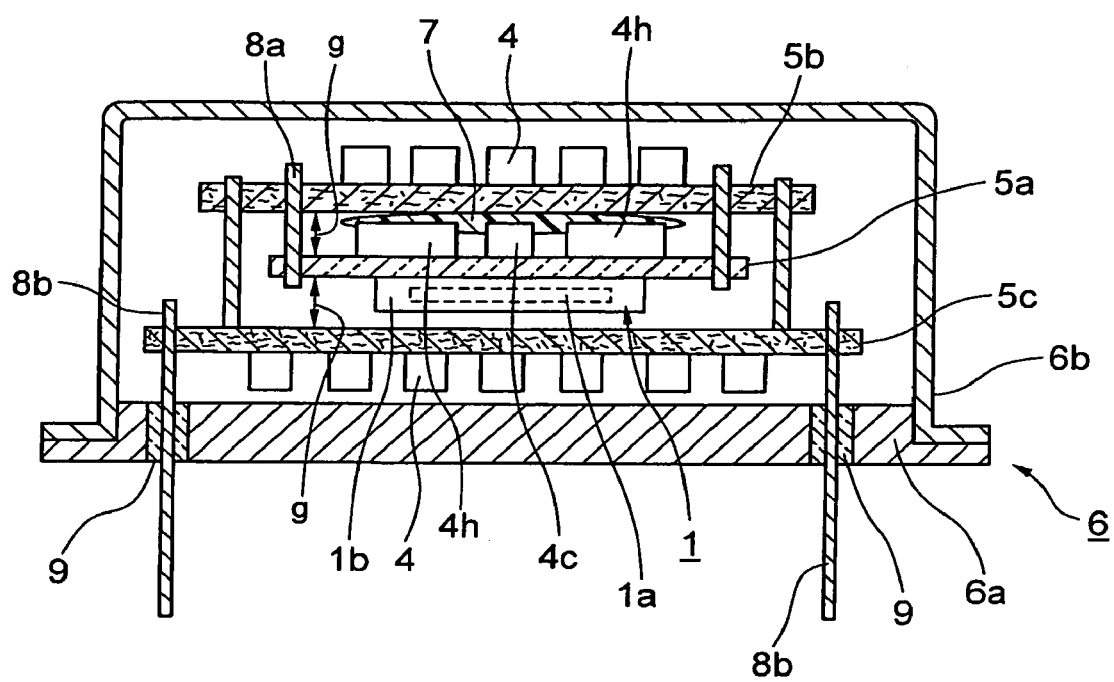
FIG. 1 is a sectional view for describing an embodiment 1 of an oven controlled crystal oscillator of the present invention.

FIG. 1 is a sectional view for describing an embodiment of an oven controlled crystal oscillator of the present invention. The same reference symbols are given to portions the same as those in the aforementioned conventional example, and descriptions thereof are therefore simplified or omitted.

Figure 6A:
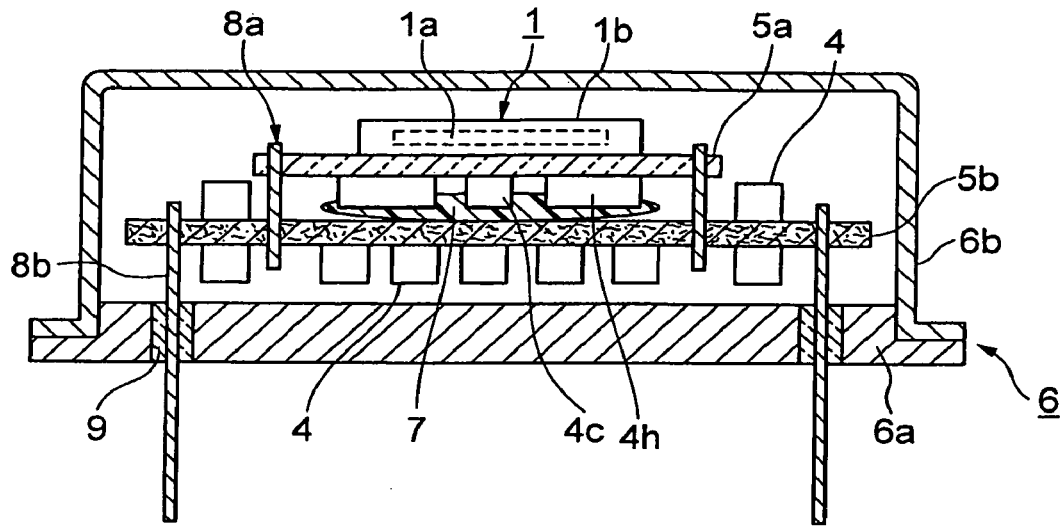
FIG. 6A is a sectional view of an oven controlled crystal oscillator.
Figure 6B:
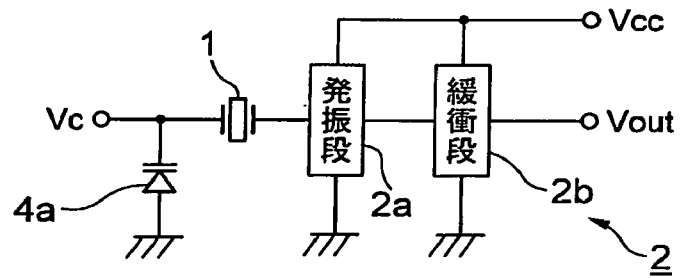
FIG. 6B is a schematic drawing of an oscillation circuit.
Figure 6C:
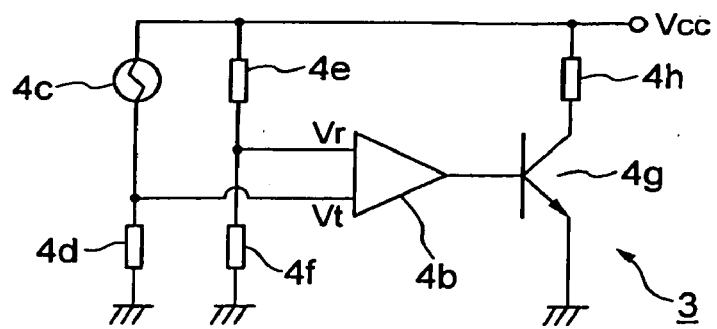
FIG. 6C is a diagram of a temperature control circuit.
Figure 7:
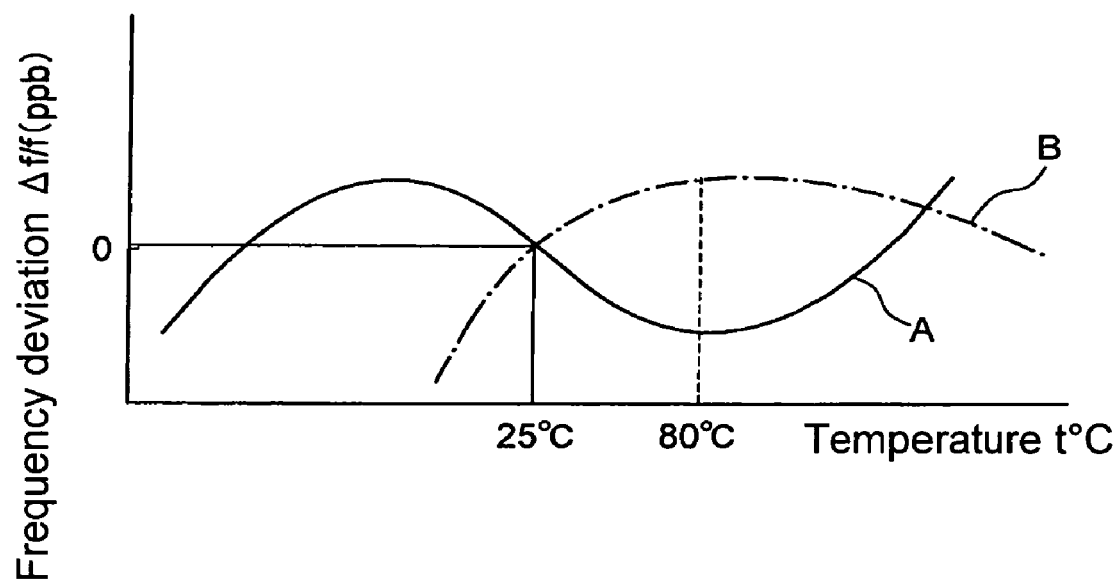
FIG. 7 is a diagram showing frequency-temperature characteristic curves in a conventional example of a crystal vibrator of AT cut and SC cut.

The oven controlled crystal oscillator of the present invention, as shown in FIG. 1, has a crystal vibrator 1, circuit elements 4 that constitute an oscillation output circuit 2 and a temperature control circuit 3 shown in FIG. 6B and FIG. 6C, first and second circuit substrates 5a and 5b, and a metallic container 6. Here, the metallic container 6 includes a metallic base 6a and a metallic cover 6b. In this embodiment, there is provided a third circuit substrate 5c in addition to the first and second circuit substrates 5a and 5b.

First, the first circuit substrate 5a, as shown in FIG. 1, has the surface mount crystal vibrator 1 arranged on one principal surface thereof, and has a heating resistor 4h and a temperature sensor element 4c arranged on the other principal surface thereof. On the heating resistor 4h and the temperature sensor element 4c, there is coated a thermally conductive resin 7, so as to be in close contact with and be thermally bonded to one principal surface of the second circuit substrate 5b. In this example, as opposed to the conventional example, the second circuit substrate 5b is arranged on an upper side (cover 6b side) while having the first circuit substrate 5a on a lower side (base 6a side).

Moreover, on the other principal surface (upper surface) of the second circuit substrate 5b, there is arranged circuit elements 4 of an oscillating stage 2a that forms an oscillation closed loop in the oscillation output circuit. Here, for example, there are included a Colpitts type voltage dividing capacitor or an oscillation transistor, and a voltage-variable capacitive element or a trimmer capacitor for oscillation frequency adjustment. On the upper surface of the second circuit substrate 5b, there are arranged circuit elements 4 including a trimmer capacitor for other adjustment purposes. With the configuration of these, the heating resistor 4h of the first circuit substrate 5a, the crystal vibrator 1, and the circuit elements 4 serving as the oscillating stage 2a of the second circuit substrate 5b, are thermally bonded.

Furthermore, on the third circuit substrate 5c, there are arranged a buffering stage 2b of the oscillation output circuit 2, and circuit elements 4 of the temperature control circuit 3 excluding the heating resistor 4h and the temperature sensor element 4c. However, in a case where a power transistor 4g of the temperature control circuit 3 is used as a heater element, these are arranged on the first and second circuit substrates 5a and 5b. The third circuit substrate 5c is connected to and held by lead wires 8b of the metallic base 6a, and the second circuit substrate 5b is connected to the third circuit substrate 5c and held by means of metallic pins 8a. That is to say, they are arranged in a multistep structure in order from the metallic base 6a side, of the third, first, and second circuit substrates 5c, 5a, and 5b, and the third circuit substrate 5c is thermally isolated, with a clearance, from the first and second circuit substrates 5a and 5b.

According to such a configuration, the crystal vibrator 1 and the circuit elements 4 of the oscillating stage 2a that determine oscillation frequency in particular, and the heating resistor 4h can be thermally bonded. In this case, it is possible, in particular, to increase the thermal bonding between the crystal vibrator 1 that governs the frequency-temperature characteristic of the oscillation frequency, and the heating resistor 4h, and to subsequently strengthen the thermal bonding with the circuit elements 4 of the oscillating stage 2a. Since it is possible, with the temperature control circuit 3 including the heating resistor 4h, to maintain the operating temperature of the crystal vibrator 1 and the circuit elements 4 of the oscillating stage 2a at a constant temperature, it is possible to stably maintain oscillation frequency.

In this case, the circuit elements 4 of the buffering stage 2b and the temperature control circuit 3 are arranged on the third circuit substrate 5c, and they are thermally isolated, with a clearance, from the first and second circuit substrates 5a and 5b. Therefore, the circuit elements 4 of the buffering stage 2b and the temperature control circuit 3 are not exposed to a high temperature, and are maintained at a temperature higher than normal temperature without reaching an extremely high temperature. Consequently, for the circuit elements 4 of the buffering stage 2b and the temperature control circuit 3, a reduction in their characteristics associated with high temperature operation can be prevented. As a result, it is possible to maintain excellent oscillation output characteristics including oscillation frequency at normal temperature.

Moreover, the heating targets of the heating resistor 4h are the crystal vibrator 1 and the circuit elements 4 of the oscillating stage 2a of the first and second circuit substrates 5a and 5b. The circuit elements 4 of the buffering stage 2b and the temperature control circuit 3 arranged on the third circuit substrate 5c are basically excluded from these heating targets. Therefore, the thermal capacity as a heating target of the heating resistor 4h can be reduced, and consequently energy efficiency is increased. Moreover, since there is a temperature distribution with the circuit elements 4 of the crystal vibrator 1 and the oscillating stage 2a of the first and second circuit substrates 5a and 5b as heating targets, temperature control becomes easier.

Embodiment 2

Figure 2:
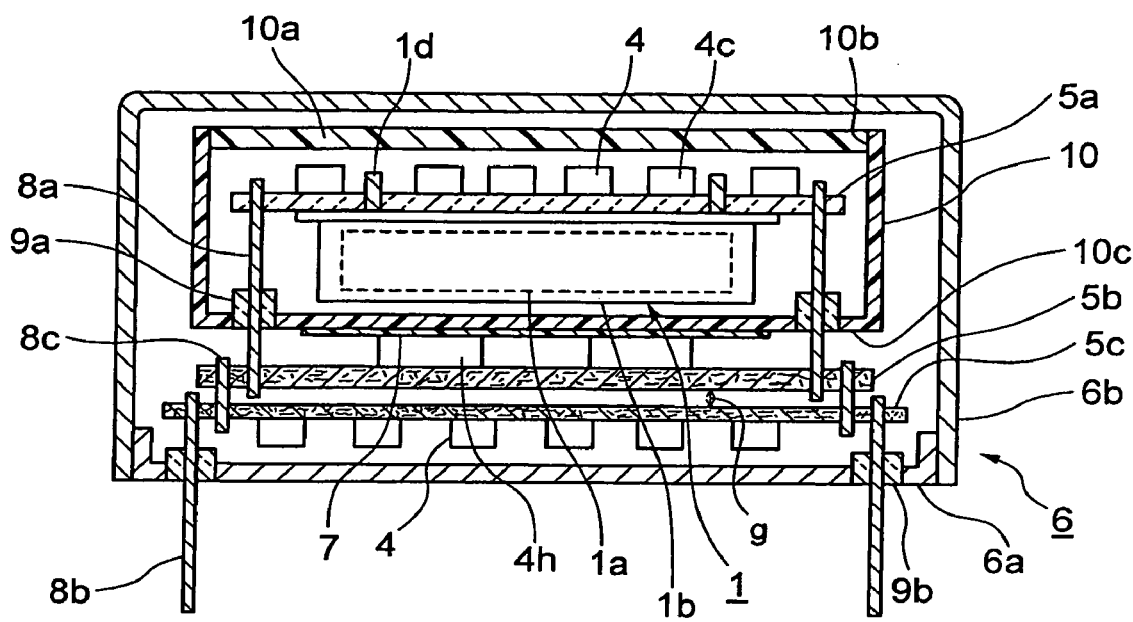
FIG. 2 is a sectional view for describing an embodiment 2 of an oven controlled crystal oscillator of the present invention.

FIG. 2 is a sectional view showing an embodiment 2 of an oven controlled crystal oscillator of the present invention. Descriptions of portions the same as those in the embodiment 1 above are omitted or simplified.

In the embodiment 2, as shown in FIG. 2, a heat cylinder 10 is used to thereby further facilitate temperature control and ensure frequency stability in ppb units. That is to say, in the embodiment 2, the crystal vibrator 1 and the circuit elements 4 of the oscillating stage 2a are arranged on the first circuit substrate 5a. The crystal vibrator 1 is, for example, such that a crystal piece 1a is seal-enclosed within a metallic container 1b by means of resistance welding, and is arranged on the one principal surface (lower surface) of the first circuit substrate 5a.

In this case, lead wires 1d of the metallic container 1b are inserted from the one principal surface of the first circuit substrate 5a through to the other principal surface (upper surface) side, and are fixed on the other principal surface by means of solder (not shown in the drawing). The circuit elements 4 of the oscillating stage 2a including a voltage-variable capacitive element and an adjustment capacitor are arranged on the upper surface of the first circuit substrate 5a. Here, on the upper surface of the first circuit substrate 5a, there are arranged an adjustment element other than the adjustment capacitor and also the temperature sensor resistor element 4c. The first circuit substrate 5a, with the crystal vibrator 1 on the lower surface side thereof, is held on the outer periphery section thereof by the lead wires 8a that: are provided in the closed surface of the sectionally concave-shaped heat cylinder 10; are made airtight by means of glass 9; and pass through the closed surface. An opening end surface 10b of the sectionally concave-shaped heat cylinder 10 is sealed, for example, by a resin substrate 10a.

The lead wires 8a passing through the closed surface are connected onto the second circuit substrate 5b and thereby the sectionally concave-shaped heat cylinder 10 is held. On the second circuit substrate 5b, there are, for example, arranged two of the heating resistors 4h, and they are brought into contact with the closed surface of the heat cylinder 10 while having the thermally conductive resin sheet 7 intervening therebetween. The second circuit substrate 5b is held on the third circuit substrate 5c by metallic pins 8c.

The third circuit substrate 5c is thermally isolated, with a clearance g, from the second circuit substrate 5b, and on the lower surface side thereof, there are arranged the circuit elements 4 of the buffering stage 2b and the temperature control circuit 3. The outer periphery section of the third circuit substrate 5c is connected to and held by the lead wires 8b in the metallic base 6a that is made airtight by means of sealing of the glass 9. On the periphery of the metallic base 6a, there is joined the metallic cover 6b by means of soldering, thereby forming the metallic container 6 for the oscillator.

According to such a configuration, the heat cylinder 10 is heated by the heating resistors 4h, and the temperature within the heat cylinder 10 is controlled by the temperature control circuit 3 including the temperature sensor element 4c, that is to say, the operating temperature of the crystal vibrator 1 and the circuit elements 4 of the oscillating stage 2a are maintained at a constant temperature. Consequently, it is possible, as with the embodiment 1, to highly stabilize oscillation frequency. In this case, the heating target of the heating resistors 4h is limited to the interior of the heat cylinder 10, and temperature distribution can be made uniform. Therefore, compared to the embodiment 1, temperature control can be facilitated and frequency stability on ppb unit can be reliably maintained.

Also in this embodiment 2, the third circuit substrate 5c having the circuit elements 4 of the buffering stage 2b and the temperature control circuit 3 arranged thereon, is thermally isolated, with a clearance, from the third circuit substrate 5b with the heating resistors 4h arranged thereon and from the heat cylinder 10. Consequently, the circuit elements 4 of the buffering stage 2b and the temperature control circuit 3 will not be made to operate at a high temperature by the heating resistors 4h, even if the outside air temperature is at normal temperature. Therefore, it is possible to maintain excellent oscillation output characteristics including oscillation frequency at a normal temperature.

Figure 3:
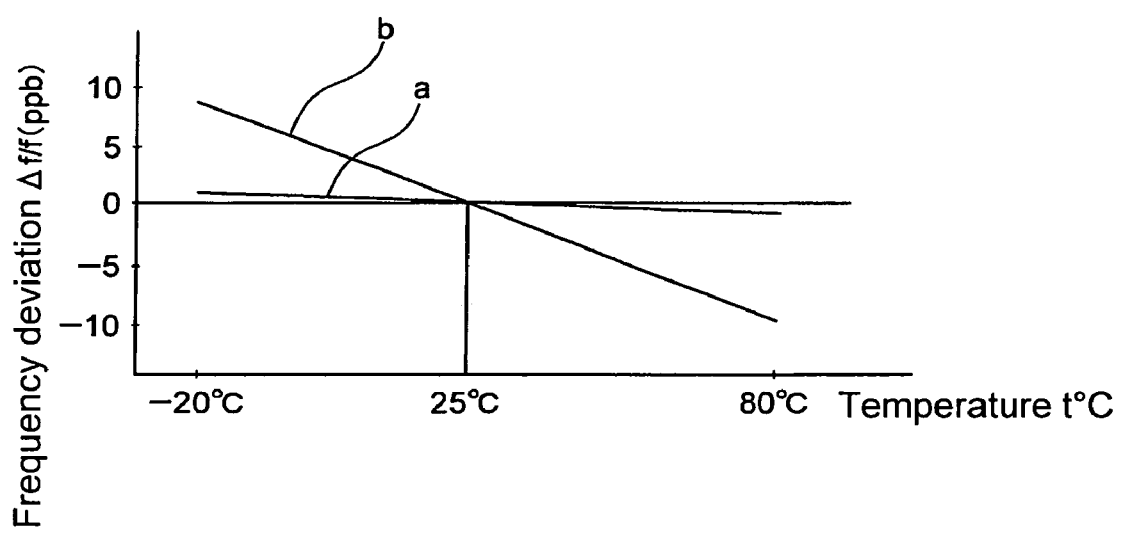
FIG. 3 shows frequency deviation characteristic lines for describing effects of the embodiment 2 of the present invention.
Figure 4:
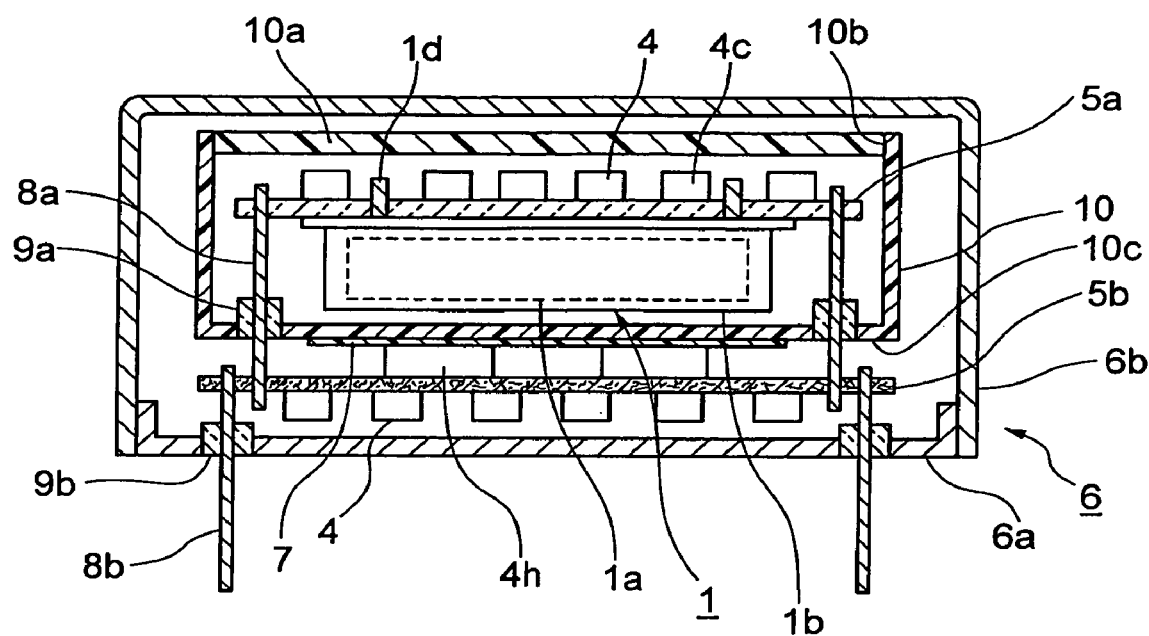
FIG. 4 is a sectional view of an oven controlled crystal oscillator to be compared, for describing the effects of the embodiment 2 of the present invention.

Incidentally, in the oven controlled crystal oscillator of the present embodiment 2, there is achieved a frequency stability, wherein the frequency deviation $\Delta f/fo$ with respect to ambient temperature is, for example, within ±2 ppb for a temperature ranging from 20 to 80° C. as shown with the straight line a in FIG. 3. On the other hand, for example, in a case where the circuit elements 4 of the buffering stage 2b and the temperature control circuit 3 are arranged on the lower surface of the second circuit substrate 5b having the heating resistors 4h arranged thereon as shown in FIG. 4, the frequency fluctuation $\Delta f/f$ is ±10 ppb as shown with the straight line b in FIG. 3.

Consequently, there is achieved an effect of the case of the present embodiment 2 where the circuit elements 4 of the buffering stage 2b and the temperature control circuit 3 are distanced from the heating resistors 4h to thereby avoid thermal influence. With either one of the straight lines a and b, the frequency deviation $\Delta f/f$ is reduced as temperature rises. However, as opposed to this, the frequency deviation $\Delta f/f$ may rise in some cases, and these depend on the temperature characteristics of the circuit side and the crystal vibrator.

Embodiment 3

Figure 5:
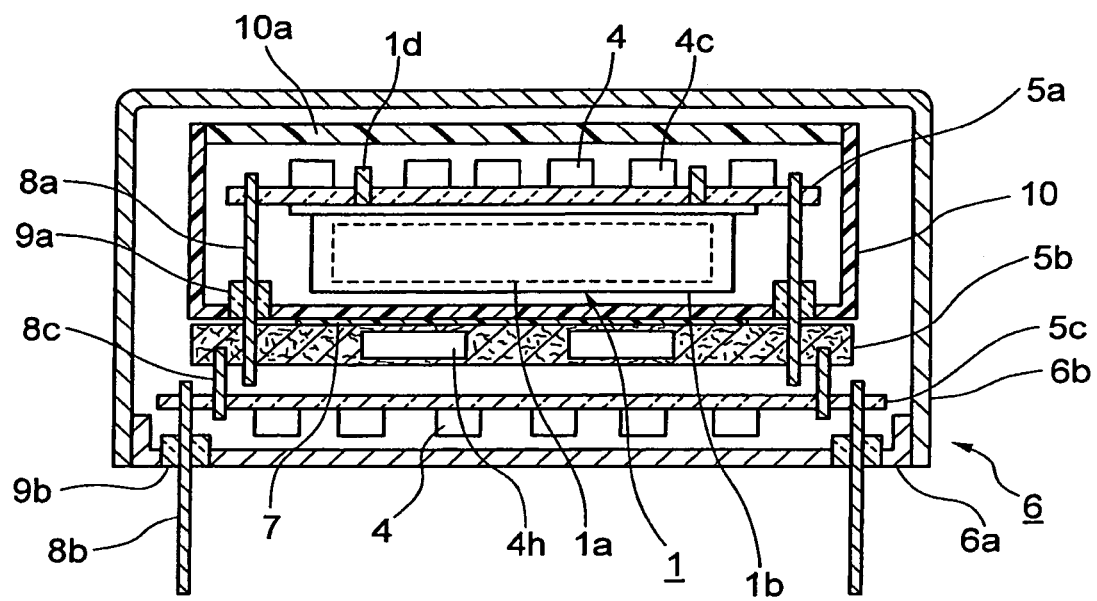
FIG. 5 is a sectional view for describing another embodiment of an oven controlled crystal oscillator of the present invention.

In the above embodiment, the heating resistor bodies 4h are arranged on the second circuit substrate 5b so as to serve as chip elements. However, the heating resistor bodies 4h may be buried in the second circuit substrate 5b as shown in FIG. 5 for example. Moreover, the heating resistor bodies 4h may be formed on the surface or in the plane of the second circuit substrate 5b as film resistors (not shown in the drawing) by means of printing or the like. In this case, the circuit substrates are ceramic substrates for example. Moreover, it is of course possible to use a power transistor 4g as a heat source instead of the heat resistor bodies 4h, or both of them may be used together.

What is claimed is:

1. An oven controlled crystal oscillator comprising: a crystal vibrator with a crystal piece seal-enclosed therein and having external terminals; circuit elements of an oscillating stage that constitutes an oscillation output circuit together with the crystal vibrator, and of a buffering stage that buffer-amplifies output of said oscillating stage; circuit elements of a temperature control circuit that at least has a heater element that heats said crystal vibrator and a temperature sensor element that detects operating temperature of said crystal vibrator, and that maintains the operating temperature of said crystal vibrator at a constant temperature; a first circuit substrate having said crystal vibrator and at least some of said circuit elements arranged thereon; circuit substrates other than said first circuit substrate that are arranged in a vertical direction with respect to said first circuit substrate and that have said crystal vibrator and circuit elements other than said some circuit elements arranged thereon; and a metallic container that houses said crystal vibrator, said circuit elements, said first circuit substrate having these crystal vibrator and circuit elements arranged thereon, and the circuit substrates other than this, wherein: the circuit substrates other than said first circuit substrate include a second circuit substrate and a third substrate; on said first circuit substrate or said second circuit substrate, there are arranged said heater element and the circuit element of said oscillating stage thermally bonded to said heater element; on said third circuit substrate, there are arranged the circuit element of said buffering stage, and at least the circuit elements of said temperature control circuit excluding said heater element and said temperature sensor element; and said third circuit substrate is arranged so as to be distanced in the vertical direction and thermally isolated by a thermally conductive resin, with a clearance, from said first and second circuit substrates.

2. An oven controlled crystal oscillator according to claim 1, wherein: said first circuit substrate has said crystal vibrator arranged on one of the principal surfaces thereof, and has said heater element on the other principal surface thereof; on said second circuit substrate there is arranged the circuit element of said oscillating stage; and said heater element of said first circuit substrate and said second circuit substrate is thermally bonded by means of a thermally conductive resin.

3. An oven controlled crystal oscillator according to claim 1, wherein said crystal vibrator and the circuit element of said oscillating stage are arranged on said first circuit substrate and are housed within a heat cylinder, and said heat cylinder is thermally bonded to said heater element arranged on said second circuit substrate by means of a thermally conductive resin.

4. An oven controlled crystal oscillator according to claim 1, wherein said heater element is a chip resistor or a power transistor in said temperature control circuit.

* * * * *

UNITED STATES PATENT AND TRADEMARK OFFICE
CERTIFICATE OF CORRECTION

| | | |
|---|---|---|
| PATENT NO. | : 8,089,325 B2 | Page 1 of 1 |
| APPLICATION NO. | : 12/653061 | |
| DATED | : January 3, 2012 | |
| INVENTOR(S) | : Tetuo Kudo | |

It is certified that error appears in the above-identified patent and that said Letters Patent is hereby corrected as shown below:

Delete fig 6B, and substitute the fig 6B below therefor.

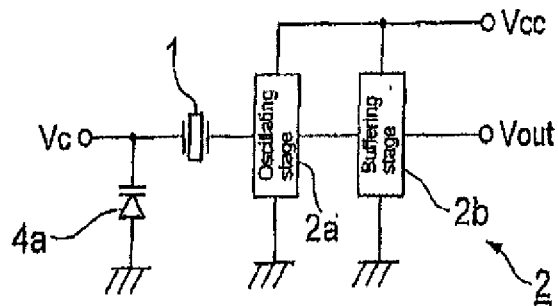

Signed and Sealed this
Fifteenth Day of May, 2012

David J. Kappos
*Director of the United States Patent and Trademark Office*